(12) United States Patent
Lin et al.

(10) Patent No.: US 10,477,122 B2
(45) Date of Patent: Nov. 12, 2019

(54) IMAGE SENSOR AND IMAGE SENSING METHOD (71) Applicant: Industrial Technology Research Institute, Hsinchu (TW)

(72) Inventors: Yan-Rung Lin, Hsinchu (TW); Pei-Wen Yen, New Taipei (TW); Siou-Cheng Lou, Hsinchu County (TW); Kai-Ping Chuang, Hsinchu County (TW)

(73) Assignee: Industrial Technology Research Institute, Hsinchu (TW)

( * ) Notice: Subject to any disclaimer, the term of this patent is extended or adjusted under 35 U.S.C. 154(b) by 117 days.

(21) Appl. No.: 15/394,826

(22) Filed: Dec. 30, 2016

(65) Prior Publication Data

US 2018/0152645 A1 May 31, 2018

(30) Foreign Application Priority Data

Nov. 29, 2016 (TW) ............................. 105139247 A (51) Int. Cl.
*H04N 5/347* (2011.01)
*H04N 5/353* (2011.01)
*H04N 5/374* (2011.01)
*H04N 5/355* (2011.01)

(52) U.S. Cl.
CPC ........... *H04N 5/347* (2013.01); *H04N 5/3532* (2013.01); *H04N 5/374* (2013.01)

(58) Field of Classification Search
CPC ....... H04N 5/374; H04N 5/347; H04N 5/3532
See application file for complete search history.

(56) References Cited

U.S. PATENT DOCUMENTS

| 7,518,645 B2 | 4/2009 | Farrier |
| 7,923,673 B2 | 4/2011 | Buttgen et al. |
| 8,248,552 B2 | 8/2012 | Ting et al. |
| (Continued) | | |

FOREIGN PATENT DOCUMENTS

| CN | 104465689 | 3/2015 |
| TW | 200713574 | 4/2007 |
| TW | 200715248 | 4/2007 |

OTHER PUBLICATIONS

"Office Action of Taiwan Counterpart Application," dated Mar. 27, 2017, p. 1-p. 6.

(Continued)

*Primary Examiner* — Lin Ye
*Assistant Examiner* — John H Morehead, III
(74) *Attorney, Agent, or Firm* — JCIPRNET (57) ABSTRACT

An image sensor including a plurality of pixels and a plurality of pixel sensing circuits is provided. The pixels are arranged in a pixel array. The pixels are configured to sense an image to obtain a plurality of reference pictures. The pixels include a plurality of pixel types. The pixel sensing circuits are respectively and electrically connected to the pixels. The pixel sensing circuits are configured to respectively receive a photo current generated by each of the pixels. The pixels have different characteristic curves based on the pixel types, and at least one of an electrode structure parameter and an electrode bias of each of the pixels is determined according to a correspondingly characteristic curve. In addition, an image sensing method is also provided.

16 Claims, 7 Drawing Sheets

(56) References Cited

U.S. PATENT DOCUMENTS

| | | |
|---|---|---|
| 8,736,733 B2 | 5/2014 | Tian et al. |
| 9,100,601 B2 | 8/2015 | Nishihara et al. |
| 9,293,487 B2 | 3/2016 | Tian et al. |
| 2004/0041927 A1* | 3/2004 | Cho .................. H04N 3/155 348/254 |
| 2007/0247536 A1* | 10/2007 | Murakami ............ H04N 5/235 348/302 |
| 2009/0059050 A1* | 3/2009 | Sakamoto ............. H04N 5/347 348/311 |
| 2010/0007778 A1* | 1/2010 | Linn; Yong ........... H04N 5/235 348/294 |
| 2012/0025060 A1* | 2/2012 | Iwata ............... H01L 27/14603 250/208.1 |
| 2012/0256078 A1* | 10/2012 | Mabuchi ............. H04N 5/2351 250/208.1 |
| 2012/0281111 A1* | 11/2012 | Jo .................... H04N 5/217 348/229.1 |
| 2015/0326806 A1* | 11/2015 | Moriwaka ........... H04N 5/3456 348/302 |
| 2016/0360134 A1* | 12/2016 | Miyake ............ H01L 27/14603 |
| 2016/0372507 A1* | 12/2016 | Yang ............... H01L 27/14621 |

OTHER PUBLICATIONS

Panasonic Corp., "Panasonic Develops Industry-First 123dB Simultaneous-Capture Wide-Dynamic-Range Technology using Organic-Photoconductive-Film CMOS Image Sensor", Panasonic Newsroom Global, Feb. 3, 2016, pp. 1-5.

\* cited by examiner

IMAGE SENSOR AND IMAGE SENSING METHOD

CROSS-REFERENCE TO RELATED APPLICATION

This application claims the priority benefit of Taiwan application serial no. 105139247, filed on Nov. 29, 2016. The entirety of the above-mentioned patent application is hereby incorporated by reference herein and made a part of this specification.

BACKGROUND

Technical Field

The disclosure relates to a sensing technique, and particularly relates to an image sensor and an image sensing method.

Description of Related Art

Along with development of image sensing technique, when an image sensor senses an image, how to achieve both characteristics of "high dynamic range" and "high sensitivity" of a sensed image is always a problem in the image sensing technique that cannot be resolved. Particularly, in view of image capturing of industrial inspection of DUT (device under test) with high reflective surface or a backlighted shot, etc., these image sensing situations may encounter the problem with great contrast, which means a great difference between a highest illuminance and a lowest illuminance in the scene. Therefore, in order to guarantee unstauration of an output voltage of each pixel of the image sensor, a light sensitivity of each pixel has to be decreased, such that the output voltage of the pixel with the highest illuminance is not saturated. However, the method of getting the great contrast may cause loss of details of a darker portion in the scene, i.e. a light intensity resolution of the darker portion is deteriorated.

In this regard, a conventional solution is to capture more reference pictures with different parameters in the image capturing and process the two or more reference pictures to obtain a specific picture of balancing both characteristics of "high dynamic range" and "high sensitivity". However, the conventional image sensing method is not adapted to a fast-motion image situation. Therefore, how to design an image sensor capable of obtaining the specific picture with high dynamic range and high sensitivity, and adapted to the fast-motion image situation is an import issue for related technicians.

SUMMARY

The disclosure is directed to an image sensor and an image sensing method, where a plurality of pixels of a plurality of pixel types are adopted to simultaneously obtain a plurality of reference pictures with different image qualities, and the image sensor is adapted to a fast-motion image situation.

The disclosure provides an image sensor including a plurality of pixels and a plurality of pixel sensing circuits. The pixels are arranged in a pixel array. The pixels are configured to sense an image to obtain a plurality of reference pictures. The pixels include a plurality of pixel types. The pixel sensing circuits are respectively and electrically connected to the pixels. The pixel sensing circuits are configured to respectively receive a photo current generated by each of the pixels. The pixels have different characteristic curves based on the pixel types, and at least one of an electrode structure parameter and an electrode bias of each of the pixels is determined according to the corresponding characteristic curve.

The disclosure provides an image sensing method adapted to an image sensor. The image sensor includes a plurality of pixels and a plurality of pixel sensing circuits, and the pixels include a plurality of pixel types. The pixels are configured to sense an image. The pixels have different characteristic curves based on the pixel types. The image sensing method includes following steps. A plurality of reference pictures are obtained by using the pixels according to the pixel types. The reference pictures are processed according to the respective characteristic curves of the pixels, so as to form a specific picture by image processing and analysis of the reference pictures.

According to the above description, the image sensor and the image sensing method of the disclosure adopt a plurality of pixels with a plurality of pixel types to sense an image, so as to obtain a plurality of reference pictures, where the reference pictures respectively have different image qualities. Therefore, the image sensor and the image sensing method of the disclosure may produce a specific picture by processing the reference pictures, and the image sensor and the image sensing method of the disclosure are adapted to the fast-motion image situation.

In order to make the aforementioned and other features and advantages of the disclosure comprehensible, several exemplary embodiments accompanied with figures are described in detail below.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DETAIL DESCRIPTION OF DISCLOSED EMBODIMENTS

Figure 1:
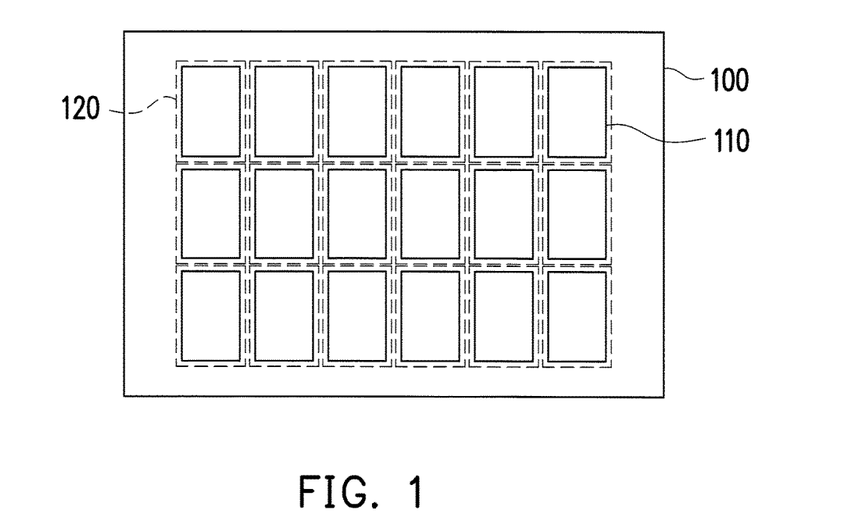
FIG. 1 is a block schematic diagram of an image sensor according to an embodiment of the disclosure.

FIG. 1 is a block schematic diagram of an image sensor according to an embodiment of the disclosure. Referring to FIG. 1, the image sensor 100 includes a plurality of pixel 110 and a plurality of pixel sensing circuits 120, where the pixel sensing circuits 120 are respectively and electrically connected to the pixels 110. In the present embodiment, the pixels 110 are arranged in a pixel array, and are configured to sense an image to obtain a plurality of reference pictures. The pixel sensing circuits 120 are configured to respectively receive a photo current generated by each of the pixels 110. In the present embodiment, the pixels 110 may respectively have different characteristic curves based on pixel types thereof. Namely, at least one of an electrode structure parameter and an electrode bias of each of the pixels 110 of the present embodiment is determined according to the corresponding characteristic curve, where the electrode structure parameter may include a gap between electrodes and/or the ratio of electrode width.

Specifically, the pixels 110 of the present embodiment include a plurality of pixel types, such that the image sensor 100 may respectively obtain one reference picture through the pixels 110 of the same pixel type. Namely, the image sensor 100 of the present embodiment may determine the number of the obtained reference pictures according to a type number of the pixel types, such that the image sensor 100 may simultaneously obtain a plurality of the reference pictures in one image capturing operation. Moreover, the image sensor 100 of the present embodiment may perform the image capturing operation by adopting a global shutter or a rolling shutter, which is not limited by the disclosure. Moreover, those skilled in the art may learn enough instructions and recommendations for the circuit characteristic of the pixel sensing circuits 120 from common knowledge of the field, so that detailed description thereof is not repeated.

Figure 2:
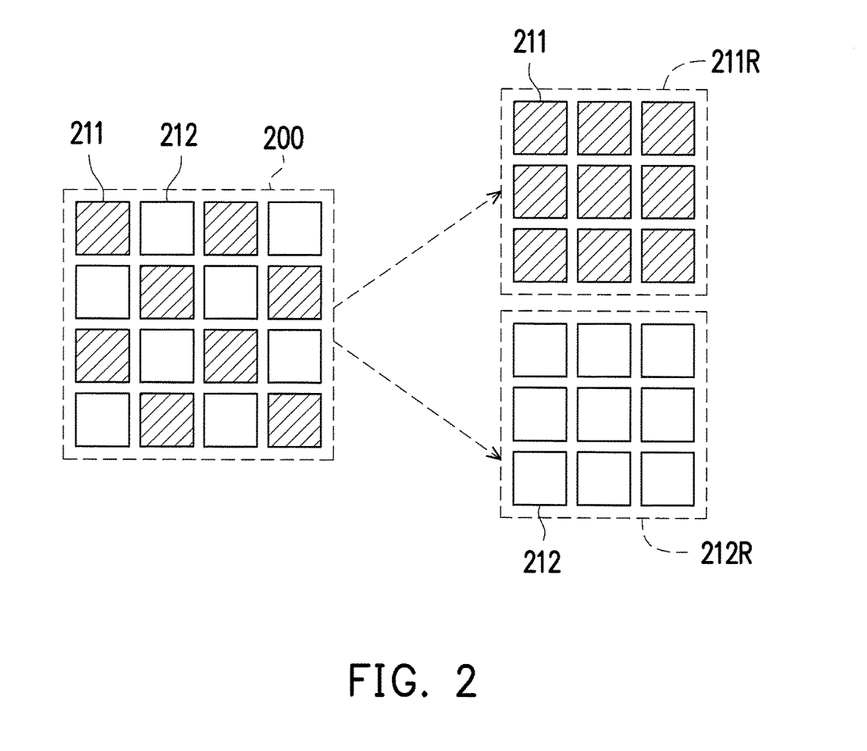
FIG. 2 is a schematic diagram of an image sensor according to another embodiment of the disclosure.
Figure 3:
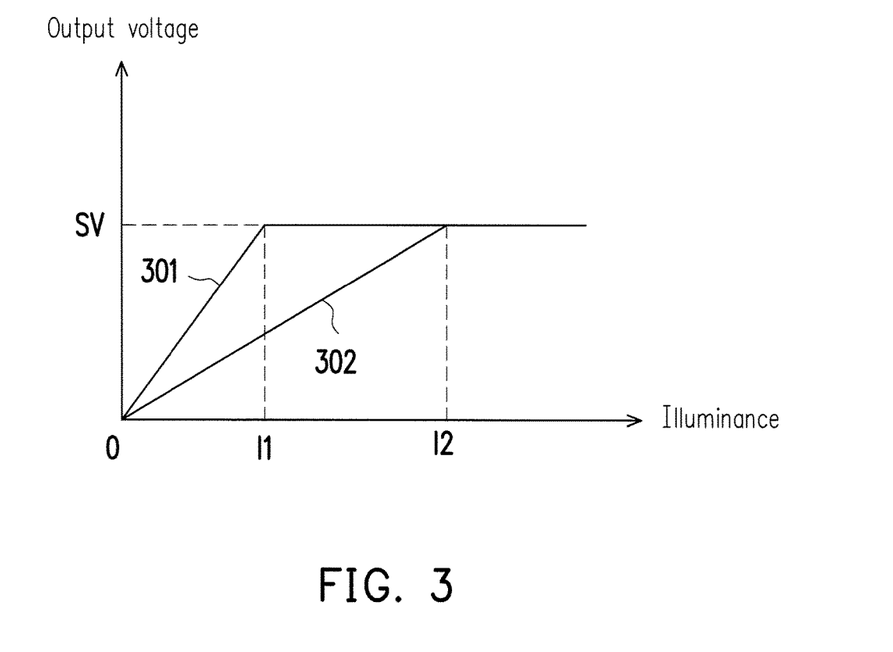
FIG. 3 is a schematic diagram of a characteristic curve of a pixel according to an embodiment of the disclosure.

FIG. 2 is a schematic diagram of an image sensor according to another embodiment of the disclosure. FIG. 3 is a schematic diagram of a characteristic curve of a pixel according to an embodiment of the disclosure. Referring to FIG. 2 and FIG. 3, the image sensor 200 of the present embodiment may include a plurality of pixels 211 and 212 of two pixel types. In the present embodiment, the pixels 211 and 212 are arranged in interleaving to form a pixel array according to the pixel types. Therefore, when the pixel sensor 200 senses an image, a pixel group 211R formed by the pixels 211 may obtain one reference picture, and a pixel group 212R formed by the pixels 212 may obtain another reference picture. Moreover, in an embodiment, the pixels 211 and 212 may construct a pixel array by adopting a configuration method of partition arrangement, which is not limited by the disclosure.

In the present embodiment, the characteristic curves 301 and 302 of FIG. 3 are characteristic curves of output voltage vs. illuminance. For example, the pixels 211 may have a characteristic shown as the characteristic curve 301 of FIG. 3, and the pixels 212 may have a characteristic shown as the characteristic curve 302 of FIG. 3. Therefore, the reference picture sensed by the pixel group 211R may, for example, have a characteristic of high sensitivity, and the reference picture sensed by the pixel group 212R may have a characteristic of high dynamic range. Namely, when the image sensor 200 senses an image, the image sensor 200 may obtain two reference pictures balancing the dynamic range and the sensitivity through one image capturing operation. Moreover, processing and analysis of the reference pictures according to the respective characteristic curves of the pixels 211 and 212 to form one specific picture.

Specifically, in the present embodiment, as an illuminance smaller than a first illuminance threshold I1, in the image processing it will adopt sensing result of the pixels 211. As an illuminance greater than the first illuminance threshold I1, in the image processing it will adopt a sensing result of the pixels 212 Such that it may combine the two reference pictures respectively obtained by the pixels 211 and the pixels 212 to obtain one specific picture having both advantages of the high dynamic range and the high sensitivity. However, in an embodiment, as an illuminance is larger than zero and smaller than the second illuminance threshold I2, in the image processing it will adopt portion sensing result of the pixels 211. As an illuminance greater than the first illuminance threshold I1 and smaller than I2, in the image processing it will adopt a sensing result of the pixels 212. The first illuminance threshold I1 and the second illuminance threshold I2 correspond to a same saturation voltage SV. Moreover, the part of the reference pictures repeatedly obtained by the image sensor 200 according to the above conditions can be analyzed and combined by using algorithms of related technical field of the image processing, which is not limited by the disclosure.

It should be noted that the characteristic curves 301 and 302 of FIG. 3 are only examples, and the disclosure is not limited thereto. The image sensor 200 of the present embodiment may pre-design a specific characteristic curve, and implement the specific characteristic curve by adjusting at least one of the electrode structure parameter and the electrode bias of each of the pixels 211 and 212. Namely, the at least one of the electrode structure parameter and the electrode bias of each of the pixels 211 and 212 of the image sensor 200 of the present embodiment can be determined according to the corresponding characteristic curve. Moreover, structure characteristics of the pixel are described below with reference of an embodiment.

Figure 4:
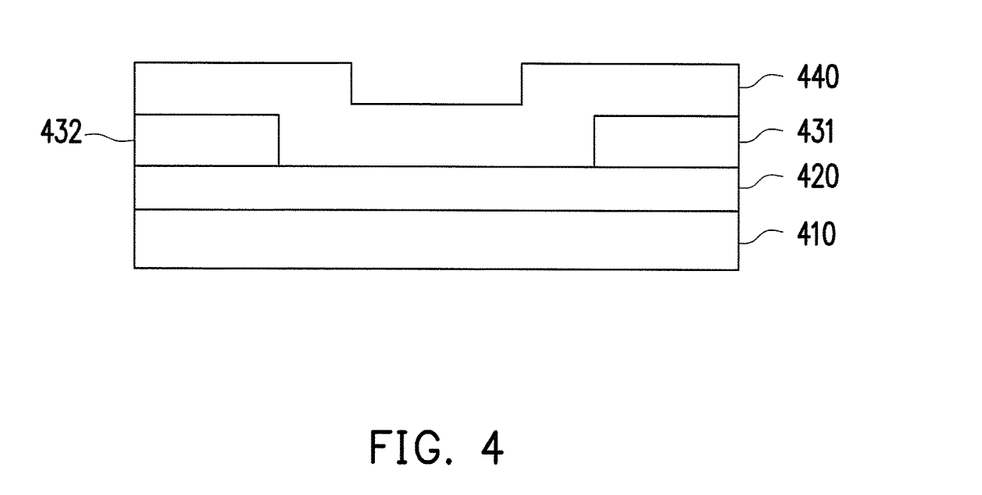
FIG. 4 is a schematic diagram of a pixel of a horizontal structure according to an embodiment of the disclosure.

FIG. 4 is a schematic diagram of a pixel of a coplanar electrodes structure according to an embodiment of the disclosure. Referring to FIG. 4, the pixel of the present disclosure is, for example, a coplanar electrodes structure. In the present embodiment, the pixel may include a first electrode 431, a second electrode 432 and an opto-electronic layer 440, and is disposed on a pixel sensing circuit 420 and a substrate 410, where the first electrode 431 and the second electrode 432 are coplanar. In the present embodiment, the first electrode 431 and the second electrode 432 are electrically connected to the pixel sensing circuit 420, and a bias provided by the pixel sensing circuit 420 crosses between the first electrode 431 and the second electrode 432. Moreover, the pixel sensing circuit 420 can be used for receiving a photo current generated by the opto-electronic layer 440 of the pixel during sensing of the picture.

Moreover, the opto-electronic layer 440 can be an organic opto-electronic layer made of a quantum dot material, a methyl ammonium lead iodide perovskite material or a methyl ammonium lead iodide chloride perovskite, etc. Moreover, the opto-electronic layer may contain two materials of an electron donor and an electron acceptor, and a structure thereof can be a bilayer heterojunction structure, or a bulk heterojunction structure, which is not limited by the disclosure. The organic opto-electric layer may further include an organic layer. The organic layer may further include at least one hole blocking layer or an electron blocking layer.

In the present embodiment, according to different biases, the opto-electronic layer 440 has different conversion efficiencies for effectively converting electrons and holes that are excited by photons into photo currents, so as to correspondingly produce different photo currents. The photo currents generated by the opto-electronic layer 440 are respectively collected and stored by capacitors in the pixel sensing circuits 420, and then converted into an output voltage. Namely, since different electrode biases may result in different efficiencies of the first electrode 431 and the second electrode 432 for receiving the photo currents, by designing a plurality of pixel types of different electrode biases, the image sensor of the present embodiment may simultaneously obtain the reference pictures of a plurality of different image qualities in one image capturing operation.

For example, the electrode biases applied on the first electrode 431 and the second electrode 432 by the pixel sensing circuit 420 is, for example, determined by the characteristic curve shown in FIG. 3. In other words, the characteristic curve of the pixel can be obtained by adjusting the electrode bias applied to the first electrode 431 and the second electrode 432, such that the image sensor may have a plurality of pixels of two or more different pixel types. However, the means of changing the characteristic curve of the pixel is not limited thereto, and the embodiments of FIG. 5 and FIG. 6 are provided exemplary embodiments of the gap between electrodes and the ratio of electrode width.

Figure 5:
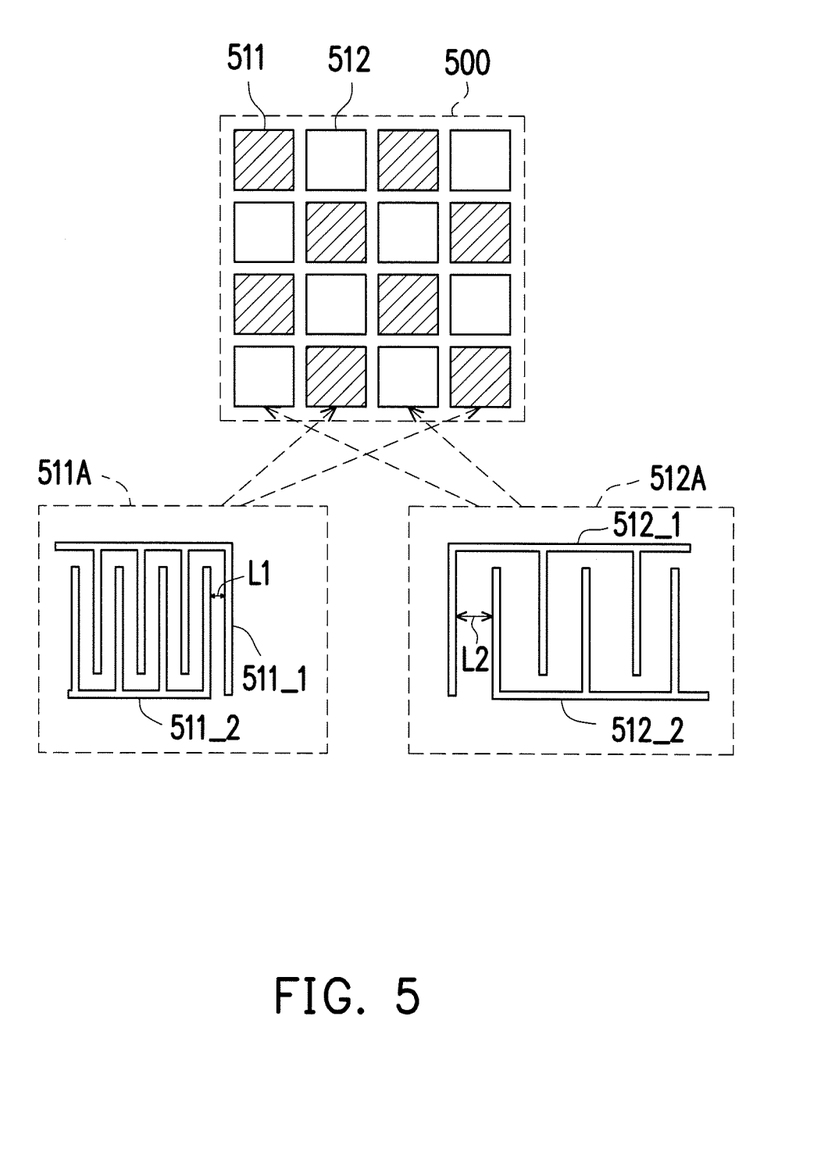
FIG. 5 is a schematic diagram of an image sensor of different pixel types according to an embodiment of the disclosure.

FIG. 5 is a schematic diagram of an image sensor of different pixel types according to an embodiment of the disclosure. Referring to FIG. 5, the image sensor 500 may include pixels 511 and 512 of two different pixel types. In the present embodiment, the pixels 511 and 512 can be semi-open pattern comb-like electrodes, where the pixels 511, for example, have a pixel type 511A, and the pixels 512, for example, have a pixel type 512A. In the pixel type 511A, the first electrode 511_1 and the second electrode 511_2 have a gap L1. In the pixel type 512A, the first electrode 512_1 and the second electrode 512_2 have a gap L2.

In the present embodiment, the greater the gap between electrodes is, the smaller a slope of the characteristic curve is. Conversely, the smaller the gap between electrodes is, the greater the slope of the characteristic curve is. Namely, since different gap between electrodes may cause different efficiencies of the first electrode and the second electrode for receiving the photo currents, the image sensor 500 may change the gaps between electrodes of the pixels 511 and 512 to adjust the image sensing characteristics thereof, so as to implement the characteristic curves shown in FIG. 3.

Figure 6:
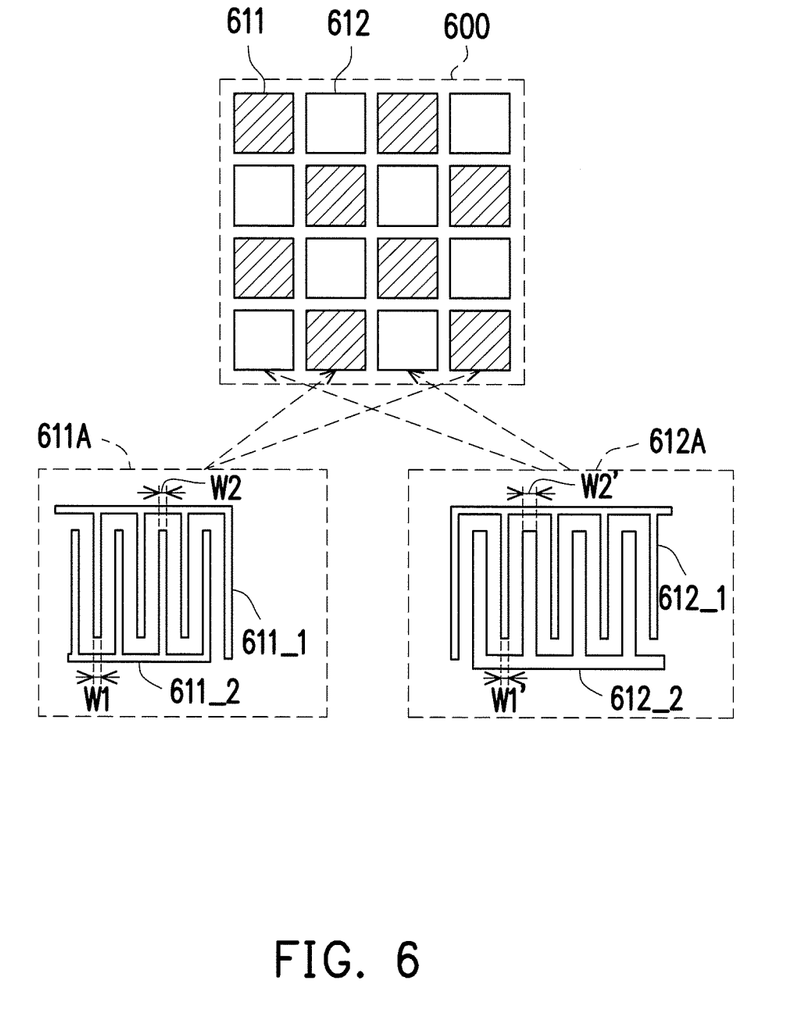
FIG. 6 is a schematic diagram of an image sensor of different pixel types according to another embodiment of the disclosure.

FIG. 6 is a schematic diagram of an image sensor of different pixel types according to another embodiment of the disclosure. Referring to FIG. 6, the image sensor 600 may include pixels 611 and 612 of two different pixel types. In the present embodiment, the pixels 611 and 612 can be semi-open pattern comb-like electrodes, where the pixels 611, for example, have a pixel type 611A, and the pixels 612, for example, have a pixel type 612A. In the pixel type 611A, the first electrode 611_1 has an electrode width W1, and the second electrode 611_2 has an electrode width W2. In the pixel type 612A, the first electrode 612_1 has an electrode width W1', and the second electrode 612_2 has an electrode width W2'. Therefore, the pixel types 611A and 612A may respectively have electrode width ratios of W1/W2 and W1/W2'.

In the present embodiment, the greater the ratio of electrode width is, the smaller the slope of the characteristic curve is. Conversely, the smaller the ratio of electrode width is, the greater the slope of the characteristic curve is. Namely, since different ratios of electrode width may cause different efficiencies of the first electrode and the second electrode for receiving the photo currents, the image sensor 600 may design the ratios of electrode width of the pixels 611 and 612 to adjust the image sensing characteristics thereof, so as to implement the characteristic curves shown in FIG. 3.

It should be noted that the pixels of the disclosure are not limited to the electrode bias or electrode structure design shown in FIG. 4-FIG. 6, and the pixels of the disclosure may also achieve a specific image sensing characteristic by simultaneously adjusting the electrode structure parameter and the electrode bias. Namely, regarding the image sensor of the present embodiment, by adjusting at least one of three conditions of the electrode bias, the gap between electrodes and the electrode width ratio of the pixels, the image sensor may have the pixels of two or more pixel types for respectively sensing the reference pictures of different image qualities.

Figure 7:
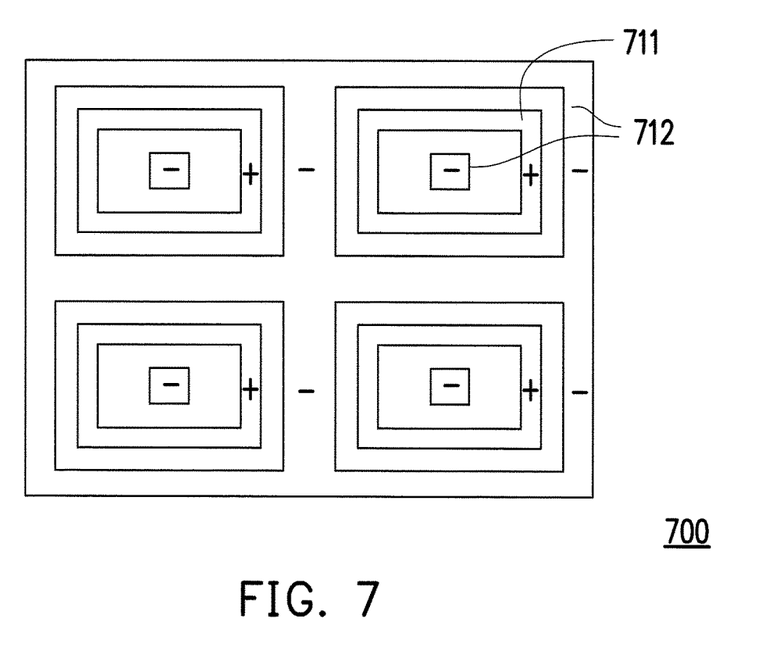
FIG. 7 is a schematic diagram of an electrode structure with a closed pattern according to an embodiment of the disclosure.
Figure 8:
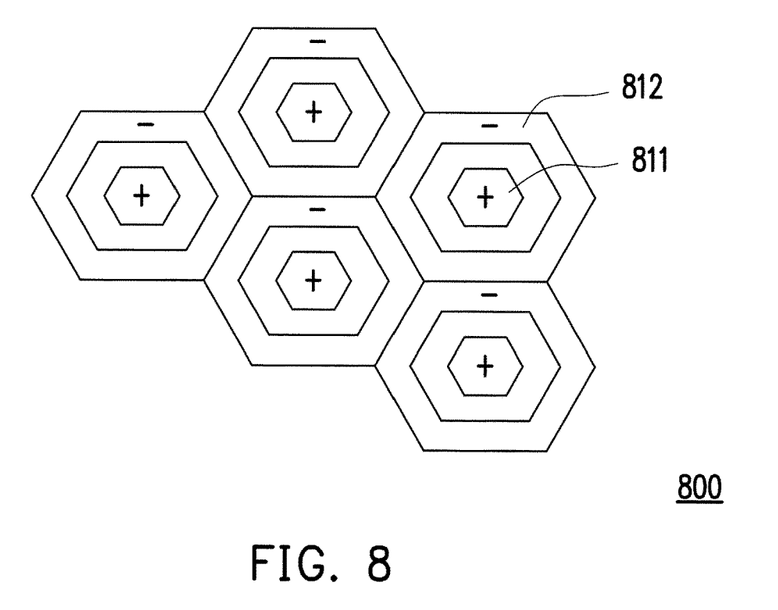
FIG. 8 is a schematic diagram of an electrode structure with a closed pattern according to another embodiment of the disclosure.

Moreover, the electrode structure and the number of electrodes of the pixels of the disclosure are not limited to the semi-open pattern comb-like electrodes shown in FIG. 5 and FIG. 6. For example, FIG. 7 is a schematic diagram of an electrode structure with a closed pattern according to an embodiment of the disclosure. Referring to FIG. 7, the pixel 700 may have first electrodes 711 and second electrodes 712 of closed rectangular-ambulatory-plane. Moreover, the pixel 700, for example, includes one first electrodes 711 and two second electrodes 712. For another example, FIG. 8 is a schematic diagram of an electrode structure with a closed pattern according to another embodiment of the disclosure. Referring to FIG. 8, the pixel 800 may have first electrodes 711 and second electrodes 712 of closed hexagons. Moreover, regarding the first electrodes and the second electrodes with the closed pattern shown in FIG. 7 and FIG. 8, the electrode bias, the gap between electrodes and the ratio of electrode width of the pixels can also be designed according to the aforementioned embodiment, such that the image sensor may have the pixels of two or more pixel types. Therefore, those skilled in the art may learn enough instructions and recommendations for related implementation of the electrode structure with closed pattern from descriptions of the aforementioned embodiments, so that detailed description thereof is not repeated.

Figure 9:
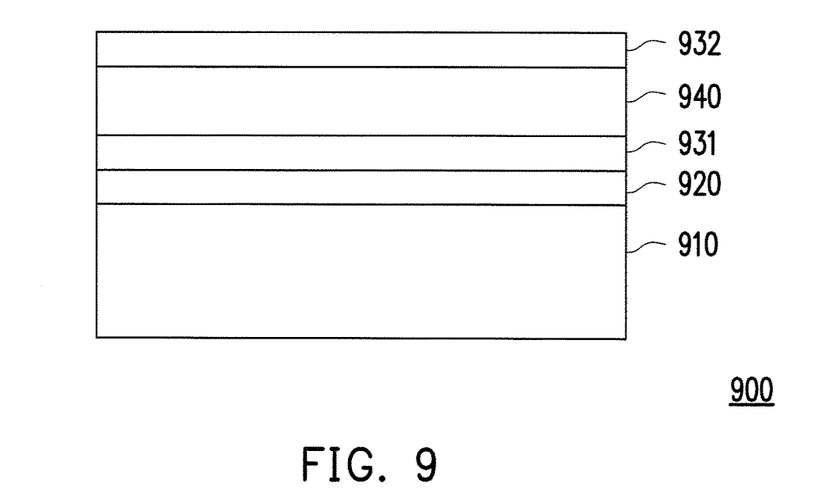
FIG. 9 is a schematic diagram of a pixel with a vertical structure according to an embodiment of the disclosure.

FIG. 9 is a schematic diagram of a pixel with a vertical structure according to an embodiment of the disclosure. Referring to FIG. 9, the pixel of the disclosure may have a vertical structure. In the present embodiment, the pixel may include a first electrode 931, a second electrode 932, a pixel sensing circuit 920 and an opto-electronic layer 940, and is disposed on the substrate 910, where the second electrode 932, the opto-electronic layer 940, the first electrode 931 and the pixel sensing circuit 920 are sequentially stacked. In the present embodiment, the first electrode 931 and the second electrode 932 are electrically connected to the pixel sensing circuit 920. The pixel sensing circuit 920 is used for receiving an electrode bias provided by the pixel sensing circuit. Moreover, the pixel sensing circuit 920 can be used for receiving the photo current generated by the opto-electronic layer 940 of the pixel when the pixel senses a picture.

In the present embodiment, the pixel of the vertical structure may also achieve the specified characteristic curves according to the adjustment method of the electrode structure parameter and the electrode bias of the aforementioned embodiment. However, regarding the pixel of the vertical structure, the electrode structure parameter may further include a thickness variation of the opto-electronic layer. Namely, in an embodiment, if the opto-electronic layer is an organic opto-electronic layer, the pixel may further include a hole blocking layer or an electron blocking layer, and the pixel of the vertical structure may achieve the specific characteristic curve by adjusting a thickness variation of at least one of the organic opto-electronic layer, the hole blocking layer and the electron blocking layer. Therefore, those skilled in the art may learn enough instructions and recommendations for related implementation of the pixel with the closed structure from descriptions of the aforementioned embodiments, so that detailed description thereof is not repeated.

Figure 10:
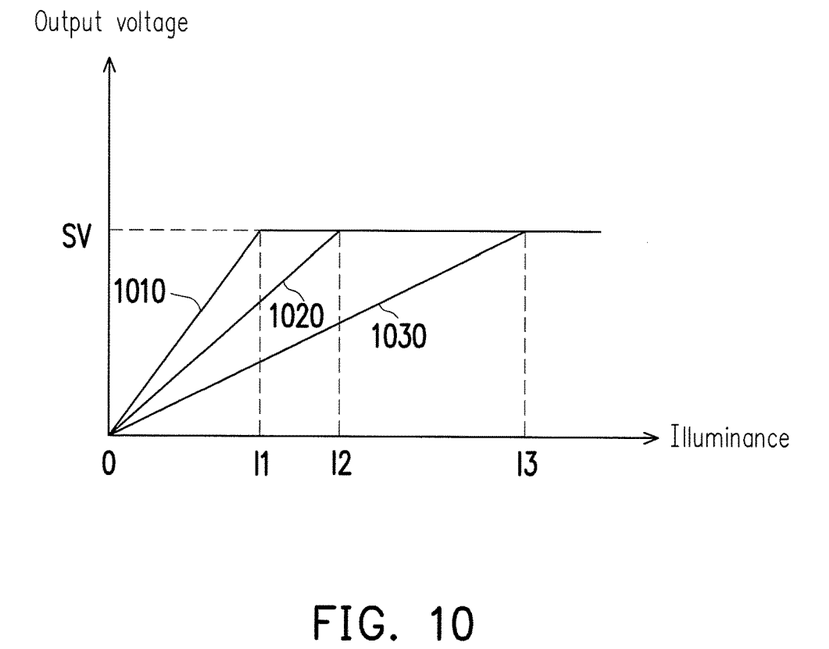
FIG. 10 is a schematic diagram of characteristic curves of pixels according to another embodiment of the disclosure.

FIG. 10 is a schematic diagram of characteristic curves of pixels according to another embodiment of the disclosure. Referring to FIG. 10, in the present embodiment, the image sensor may include a plurality of pixels of three pixel types, where the different pixel types can be designed according to the aforementioned method of designing the electrode bias, the gap between electrodes and the ration of electrode width. Therefore, the characteristic curves corresponding to the pixels of different types of the image sensor are shown in FIG. 10. In the present embodiment, the characteristic curves 1010, 1020 and 1030 of FIG. 10 are characteristic curves of output voltage/illuminance. Namely, when the image sensor execute the image capturing operation by once, three reference pictures of three different image qualities can be obtained, where the three reference pictures may respectively correspond to the different characteristic curves 1010, 1020, 1030. Moreover, the image sensor may analyze the three reference pictures, so as to select one of the three reference pictures according to the characteristic curves 1010, 1020, 1030 for presenting the portions of the picture with different illuminances.

For example, the image sensor may analyze an illuminance of each pixel in the three reference pictures. The image sensor may obtain an image sensing result of the pixel with the characteristic curve 1010 for an illuminance strength between 0 and a first illuminance threshold I1. The image sensor may obtain an image sensing result of the pixel with the characteristic curve 1020 for an illuminance strength between the first illuminance threshold I1 and a second illuminance threshold I2. The image sensor may obtain an image sensing result of the pixel with the characteristic curve 1030 for an illuminance strength between the second illuminance threshold I2 and a third illuminance threshold I3. The first illuminance threshold I1, the second illuminance threshold I2 and the third illuminance threshold I3 correspond to a same saturation voltage SV. Therefore, the image sensor of the present embodiment may combine the three reference pictures to obtain a specific picture having the characteristics of high dynamic range and high sensitivity.

Figure 11:
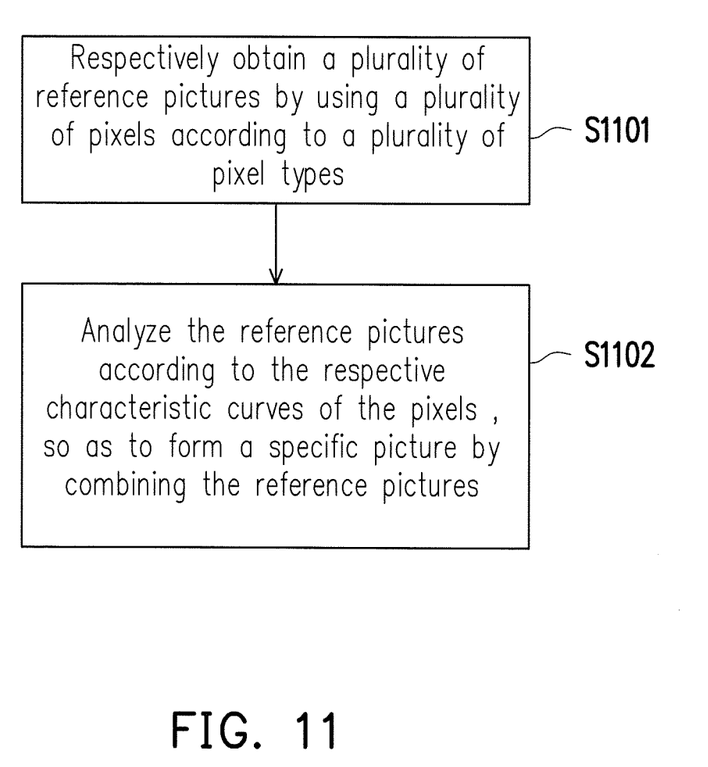
FIG. 11 is a flowchart illustrating an image sensing method according to an embodiment of the disclosure.

FIG. 11 is a flowchart illustrating an image sensing method according to an embodiment of the disclosure. Referring to FIG. 1 and FIG. 11, the image sensing method of the present embodiment is at least adapted to the image sensor 100 of FIG. 1. The image sensor 100 includes a plurality of pixels 110 and a plurality of pixel sensing circuits 120. In step S1101, the image sensor 100 obtains a plurality of reference pictures by using a plurality of the pixels 110 according to a plurality of the pixel types. In step S1102, the image sensor 100 analyzes the obtained reference pictures according to the respective characteristic curves of the pixels 110, so as to form a specific picture by combining the reference pictures. Namely, according to the image sensing method of the present embodiment, when the image capturing operation is performed by once, the pixels of two or more pixel types of the image sensor may simultaneously obtain two or more reference pictures with different image qualities. Moreover, the image sensor of the present embodiment may analyze an illuminance of each pixel in the plurality of reference pictures according to the characteristic curves of different pixel types, so as to combine the specific picture having both of the characteristics of high dynamic range and high sensitivity. The image sensor 100 that the image sensing method of the present embodiment is applied may further include a processor or a single or multiple integrated circuit chips to perform a related image processing operation and algorithm of the above method, e.g. step S1102.

Moreover, those skilled in the art may learn enough instructions and recommendations for the image sensor method of the present embodiment from the embodiments of FIG. 1 to FIG. 10, so that detailed description thereof is not repeated.

In summary, the image sensor and the image sensing method of the disclosure adopt a plurality of pixels with a plurality of pixel types to sense an image, so as to obtain a plurality of reference pictures. The pixel of the disclosure may have different characteristic curves according to different pixel types and correspond to a plurality of image qualities. Moreover, by designing the pixels of the image sensor to have at least one of the different electrode bias, the gap between electrodes and the ration of electrode width, the pixels may have different image sensing characteristics according to the pixel types, for example, adapted to sense an picture with the high dynamic range or adapted to sense an picture with the high sensitivity. Namely, the image sensor and the image sensing method of the image sensor of the disclosure may obtain the reference pictures of a plurality of image qualities in one image capturing operation. In this way, the image sensor and the image sensing method of the disclosure may analyze and combine the reference pictures to obtain the specific picture balancing a plurality of image qualities, so as to be adapted to the fast-motion image situation.

It will be apparent to those skilled in the art that various modifications and variations can be made to the structure of the disclosure without departing from the scope or spirit of the disclosure. In view of the foregoing, it is intended that the disclosure cover modifications and variations of this disclosure provided they fall within the scope of the following claims and their equivalents.

What is claimed is:
1. An image sensor, comprising
a plurality of pixels, arranged in a pixel array, and configured to sense an image to obtain a plurality of reference pictures, wherein the pixels have a plurality of pixel types; and
a plurality of pixel sensing circuits, respectively and electrically connected to the pixels, and configured to respectively receive a photo current generated by each of the pixels,
wherein the pixels respectively comprise:
a first electrode and a second electrode, electrically connected to the pixel sensing circuits, and configured to receive an electrode bias provided by the pixel sensing circuits; and
an opto-electronic layer, disposed between the first electrode and the second electrode, and configured to produce the photo current corresponding to reference pictures according to the electrode bias,
wherein the first electrode and the second electrode have a semi-open comb-like pattern,
wherein the first electrode and the second electrode are coplanar and alternately disposed on a substrate,
wherein the pixels respectively have a different corresponding characteristic curve based on the pixel types, and at least one of an electrode structure parameter and an electrode bias of each of the pixels is determined according to the corresponding characteristic curves.

2. The image sensor as claimed in claim 1, wherein the electrode structure parameter comprises at least one of a gap between electrodes and a ratio of electrode width.

3. The image sensor as claimed in claim 1, wherein the pixels are arranged in interleaving according to the pixel types, so as to form the pixel array.

4. The image sensor as claimed in claim 1, wherein the pixels are arranged in partitions according to the pixel types, so as to form the pixel array.

5. The image sensor as claimed in claim 1, wherein the pixels respectively obtain the reference pictures according to the pixel types, and the image sensor analyzes the reference pictures according to the corresponding characteristic curves of the pixels, so as to combine the reference pictures to form a specific picture.

6. The image sensor as claimed in claim 5, wherein the pixels obtain the reference pictures according to the pixel types in one image capturing operation.

7. The image sensor as claimed in claim 5, wherein the reference pictures respectively correspond to a group of the pixels with the same pixel type, and the number of the reference pictures is equal to the number of the pixel types.

8. The image sensor as claimed in claim 1, wherein the image sensor obtains the reference pictures through the pixels in a global shutter manner.

9. The image sensor as claimed in claim 1, wherein the image sensor obtains the reference pictures through the pixels in a rolling shutter manner.

10. An image sensing method, adapted to an image sensor, wherein the image sensor comprises a plurality of pixels and a plurality of pixel sensing circuits, and the pixels comprise a plurality of pixel types, wherein the pixels are configured to sense an image, and the pixels have different corresponding characteristic curves based on the pixel types, the image sensing method comprising:
respectively obtaining a plurality of reference pictures by using the pixels according to the pixel types; and
analyzing the reference pictures according to the corresponding characteristic curves of the pixels, so as to form a specific picture by combining the reference pictures,
wherein the pixels respectively comprise a first electrode, a second electrode and an opto-electronic layer, and the first electrode and the second electrode are coplanar and alternately disposed on a substrate,
wherein the first electrode and the second electrode have a semi-open comb-like pattern.

11. The image sensing method as claimed in claim 10, wherein at least one of an electrode structure parameter and an electrode bias of each of the pixels is determined according to the corresponding characteristic curve.

12. The image sensing method as claimed in claim 11, wherein the electrode structure parameter comprises at least one of a gap between electrodes and a ratio of electrode width.

13. The image sensing method as claimed in claim 11, wherein the step of respectively obtaining the reference pictures by using the pixels according to the pixel types comprises:
receiving the electrode bias provided by one of the pixel sensing circuits through the pixels, such that the pixels respectively produce a photo current corresponding to one of the reference pictures to one of the pixel sensing circuits according to the electrode bias.

14. The image sensing method as claimed in claim 10, wherein the pixels obtain the reference pictures according to the pixel types in one image capturing operation.

15. The image sensing method as claimed in claim 10, wherein the reference pictures respectively correspond to a group of the pixels with the same pixel type, and the number of the reference pictures is equal to the number of the pixel types.

16. An image sensor, comprising:
a plurality of pixels, arranged in a pixel array, and configured to sense an image to obtain a plurality of reference pictures, wherein the pixels have a plurality of pixel types; and
a plurality of pixel sensing circuits, respectively and electrically connected to the pixels, and configured to respectively receive a photo current generated by each of the pixels,
wherein the pixels respectively comprise:
a first electrode and a second electrode, electrically connected to the pixel sensing circuits, and configured to receive an electrode bias provided by the pixel sensing circuits; and
an opto-electronic layer, disposed between the first electrode and the second electrode, and configured to produce the photo current corresponding to reference pictures according to the electrode bias,
wherein the first electrode, the second electrode and the opto-electronic layer are vertically disposed on a substrate, such that the second electrode, the opto-electronic layer and the first electrode are sequentially stacked,
wherein the pixels respectively have a different corresponding characteristic curve based on the pixel types, and at least one of an electrode structure parameter and an electrode bias of each of the pixels is determined according to the corresponding characteristic curves.

* * * * *